United States Patent
Jain et al.

(10) Patent No.: US 10,901,020 B2
(45) Date of Patent: Jan. 26, 2021

(54) DIGITAL DUTY-CYCLE MONITORING OF A PERIODIC SIGNAL

(71) Applicant: QUALCOMM Incorporated, San Diego, CA (US)

(72) Inventors: Palkesh Jain, Bangalore (IN); Rahul Gulati, San Diego, CA (US); Edward Jacob Meisarosh, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 209 days.

(21) Appl. No.: 16/118,280

(22) Filed: Aug. 30, 2018

(65) Prior Publication Data

US 2020/0072885 A1 Mar. 5, 2020

(51) Int. Cl.
*G01R 29/027* (2006.01)
*G06F 1/10* (2006.01)
*H03K 3/037* (2006.01)
*H03K 7/08* (2006.01)

(52) U.S. Cl.
CPC ........... *G01R 29/0273* (2013.01); *G06F 1/10* (2013.01); *H03K 3/037* (2013.01); *H03K 7/08* (2013.01)

(58) Field of Classification Search
CPC .......... G01R 29/0273; G01R 31/31727; G01R 29/02; G06F 1/10; H03K 3/037; H03K 7/08
USPC ............................................ 324/76.12, 76.39
See application file for complete search history.

(56) References Cited

U.S. PATENT DOCUMENTS

| | | | |
|---|---|---|---|
| 9,897,651 B2 * | 2/2018 | Bansal | G06F 1/04 |
| 2007/0103141 A1 | 5/2007 | Dixon et al. | |
| 2010/0019757 A1 * | 1/2010 | Tiwari | G01R 31/31727 324/76.12 |
| 2014/0184243 A1 | 7/2014 | Iyer et al. | |

OTHER PUBLICATIONS

International Search Report and Written Opinion—PCT/US2019/048915—ISA/EPO—dated Dec. 12, 2019.

* cited by examiner

*Primary Examiner* — Farhana A Hoque
(74) *Attorney, Agent, or Firm* — Edward J. Meisarosh

(57) ABSTRACT

In one embodiment, a system including a duty-cycle-monitoring circuit is configured to receive a monitored signal having cycles that have a high portion and a low portion. The duty-cycle-monitoring circuit includes: a cascade of buffers including a first buffer, wherein the first buffer is configured to receive a first signal based on the monitored signal, a plurality of corresponding flip-flops. Each flip-flop is triggered by a second signal based on the monitored signal. The data input of each flip-flop is connected to an output of a corresponding buffer. The duty-cycle-monitoring circuit further includes a control circuit configured to determine, based on a state of the plurality of flip-flops, a measure of the duration of the high portion of a cycle of the monitored signal and determine, based on a state of the plurality of flip-flops, a measure of duration of the low portion of a cycle of the monitored signal.

26 Claims, 7 Drawing Sheets

DIGITAL DUTY-CYCLE MONITORING OF A PERIODIC SIGNAL

BACKGROUND

Clock signals are periodic signals used in many digital devices. Clock signals are typically in the form of square waves defined by regularly occurring transitions—upticks and downticks—between low and high voltage values. Components of digital circuits, such as logic and memory, are typically activated by upticks of their corresponding clock signal. A typical digital device may have multiple clock sources outputting multiple clock signals at multiple corresponding frequencies. Note that multiple different clock signals may be sourced from a single clock generator by using clock-modifying components such as dividers and multipliers. As used herein, a clock source refers to a component that outputs a clock signal and a clock generator refers to a clock source that does not receive a clock signal as an input. Many clock generators and/or sources are adjustable and can output a clock signal at variable frequencies.

One example of a particular type of digital device is an automotive control system known as an Advanced Driver Assistance System (ADAS), which automates, adapts, and/or enhances an automobile's operation. An ADAS is typically implemented as a system on chip (SoC) device. An ADAS may be configured to use information collected from the automobile's sensors (e.g., accelerometer, radar, lidar, geospatial positioning, etc.) to automatically detect a potential road hazard, and assume control over all or a portion of the vehicle's operations (e.g., braking, steering, etc.) to avoid the detected hazards. Features and functions commonly associated with an ADAS include adaptive cruise control, automated lane detection, lane-departure warning, automated steering, automated braking, and automated accident avoidance.

Due to the speed at which automobiles travel, and the significant risk automobiles pose to passengers, other motorists, bicyclists, and pedestrians, today's automobiles are increasingly dependent on the speed, accuracy, safety, and security of their embedded electronic components, such as their ADAS. One way to enhance vehicle safety is to ensure that the clock signals provided to components are accurate. This may be achieved using clock monitoring.

Conventional clock monitoring solutions require the use of a reference clock. Such conventional solutions compare the output of a monitored clock to the output of the reference clock to identify inconsistencies or abnormalities. However, the reference clock is subject to limitations similar to those of the clock being monitored. For example, the reference clock is susceptible to the same malfunctions and attacks to which the clock being monitored is susceptible. In addition, the reference clock must always remain in a running state and the reference clock must always be accurate. Further, the inclusion and use of a reference clock may be an inefficient use of the system's limited resources, and may slow or limit the system's performance and responsiveness. For these and other reasons, novel and different solutions may be useful.

SUMMARY

The following summary is not an extensive overview of all contemplated embodiments, and is not intended to either identify key critical elements of all embodiments or delineate the scope of all embodiments. The summary's sole purpose is to present some concepts of one or more embodiments in a simplified form as a prelude to the more detailed description that is presented later.

In one embodiment, a system comprises a duty-cycle-monitoring circuit. The duty-cycle-monitoring circuit comprises a cascade of buffers, a plurality of corresponding dual-edge-triggered flip-flops, and a control circuit. A first buffer is configured to receive a first signal comprising cycles that have a high portion and a low portion. Each flip-flop is triggered by a second signal based on the first signal. The data input of each flip-flop is connected to the output of the corresponding buffer. The control circuit is configured to obtain, based on a state of the series of flip-flops, a measure of the high portion of a cycle of the first signal, obtain, based on a state of the series of flip-flops, a measure of the low portion of a cycle of the first signal, and use the measures of the high and low portions to determine whether the duty cycle of first signal has an expected value.

In another embodiment, a method for a system comprising a duty-cycle-monitoring circuit comprises receiving, by the duty-cycle-monitoring circuit, a monitored signal having cycles that have a high portion and a low portion; providing a first signal based on the monitored signal to a first buffer of a cascade of buffers; providing a second signal based on the monitored signal to each of a plurality of flip-flops corresponding to the cascade of buffers, wherein: each flip-flop is triggered by the second signal and the data input of each flip-flop is connected to the output of the corresponding buffer; obtaining, based on a state of the series of flip-flops, a measure of the high portion of a cycle of the monitored signal; and obtaining, based on a state of the series of flip-flops, a measure of the low portion of a cycle of the monitored signal.

In yet another embodiment, a system comprises means for monitoring the duty cycle of a monitored signal. The system comprises: means for receiving the monitored signal, which has cycles that have a high portion and a low portion; means for providing a first signal based on the monitored signal to a first buffer of a cascade of buffers; means for providing a second signal based on the monitored signal to each of a plurality of flip-flops corresponding to the cascade of buffers, wherein: each flip-flop is triggered by the second signal and the data input of each flip-flop is connected to the output of the corresponding buffer; means for obtaining, based on a state of the series of flip-flops, a measure of the high portion of a cycle of the monitored signal; and means for obtaining, based on a state of the series of flip-flops, a measure of the low portion of a cycle of the monitored signal.

BRIEF DESCRIPTION OF THE DRAWINGS

The disclosed embodiments will hereinafter be described in conjunction with the appended drawings, provided to illustrate and not to limit the disclosed embodiments, wherein like designations denote like elements, and in which.

DETAILED DESCRIPTION

Figure 1:
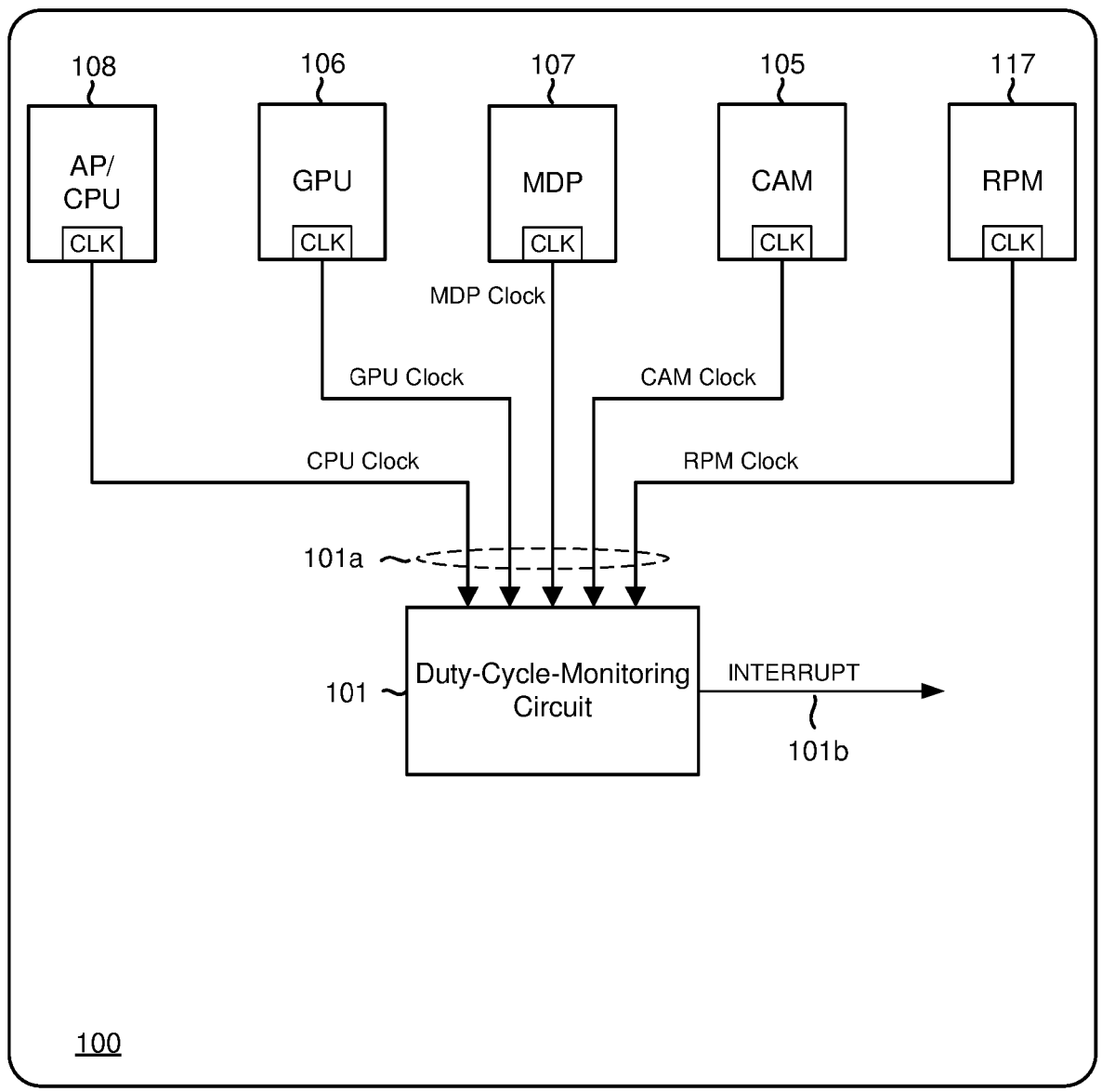
FIG. 1 is a simplified partial schematic diagram of an exemplary computer system in accordance with one embodiment.

Various embodiments are now described with reference to the drawings. In the following description, for purposes of explanation, specific details are set forth to provide a thorough understanding of one or more embodiments. It may be evident, however, that such embodiment(s) may be practiced without these specific details. Additionally, the term "component" as used herein may be one of the parts that make up a system, may be hardware, firmware, and/or software stored on a computer-readable medium, and may be divided into other components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples. Note that, for ease of reference and increased clarity, only one instance of multiple substantially identical elements may be individually labeled in the figures.

As used herein, the term "exemplary" means "serving as an example, instance, or illustration." Any example described as "exemplary" is not necessarily to be construed as preferred or advantageous over other examples. Likewise, the term "examples" does not require that all examples include the discussed feature, advantage, or mode of operation. Use of the terms "in one example," "an example," "in one embodiment," and/or "an embodiment" in this specification does not necessarily refer to the same embodiment and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," and any variant thereof, mean any connection or coupling between elements, either direct or indirect, and can encompass a presence of an intermediate element between two elements that are "connected" or "coupled" together via the intermediate element. Coupling and connection between the elements can be physical, logical, or a combination thereof. Elements can be "connected" or "coupled" together, for example, by using one or more wires, cables, printed electrical connections, electromagnetic energy, and the like. The electromagnetic energy can have a wavelength at a radio frequency, a microwave frequency, a visible optical frequency, an invisible optical frequency, and the like, as practicable. These are several non-limiting and non-exhaustive examples.

A reference using a designation such as "first," "second," and so forth does not limit either the quantity or the order of those elements. Rather, these designations are used as a convenient method of distinguishing between two or more elements or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" or "one or more of A, B, or C" or "at least one of the group consisting of A, B, and C" used in the description or the claims can be interpreted as "A or B or C or any combination of these elements." For example, this terminology can include A, or B, or C, or (A and B), or (A and C), or (B and C), or (A and B and C), or 2A, or 2B, or 2C, and so on.

The terminology used herein is for the purpose of describing particular examples only and is not intended to be limiting. As used herein, the singular forms "a," "an," and "the" include the plural forms as well, unless the context clearly indicates otherwise. Further, the terms "comprises," "comprising," "includes," and "including," specify a presence of a feature, an integer, a step, a block, an operation, an element, a component, and the like, but do not necessarily preclude a presence or an addition of another feature, integer, step, block, operation, element, component, and the like.

For automotive applications (e.g., ADAS), there are a number of safety standards that must be met by the vehicle's computerized components. For example, a manufacturer may define a fault tolerant time interval (FTTI) during which any abnormality (e.g., variation, glitch, etc.) should to be detected, flagged, and reported. For example, critical clocks for automotive applications should be monitored at least once in every interval (e.g., FTTI of 200 milliseconds) to ensure that the clocks are operating correctly or as expected. This safety requirement ensures that the system/vehicle has sufficient time to take a corrective action before an abnormally might causes a significant failure (e.g., a malfunction in the braking or steering systems, etc.). Conventional clock monitoring solutions are not sufficiently fast or efficient to monitor a clock once every fault tolerant time interval (FTTI) without the monitoring operations causing a significant negative impact on the system's performance or responsiveness.

Generally, any variation in the waveform or frequency of a critical clock in a computerized system could cause a failure. Consequently, it is important to repeatedly and continuously monitor the critical clocks in automobile systems to ensure that the clocks are operating correctly and as expected (e.g., without variations or glitches, etc.). Further, due to the speed at which automobiles may travel and the significant risk automobiles pose in case of malfunction, it is also important to identify, report, and respond to such variations or abnormalities quickly and efficiently.

In addition to causing failures, a variation in clock waveform (or other inconsistencies) could be used for, or may be a result of, an attack, such as a security hack. For example, undetected variations may allow a hacker or attacker to launch a fault injection or "clock glitching" attack. Such attacks could be used to alter the execution flow of software and, potentially, allow an attacker to introduce and/or execute malware (or an unintended/erroneous code path) in the device/system. In modern automobiles, such an attack could cause a vehicle's processors and/or SoCs to malfunction, potentially causing a collision or accident. Such an attack could also provide an attacker with access to personal and/or confidential information, such as the driver's current location, whether the driver is currently away from home, etc. Thus, clock monitoring is important for preventing failures as well as maintaining the system's safety and security.

Duty cycle, as used herein, refers to the ratio of the high part of a cycle (or period) to the entirety of the cycle (or period) of a periodic signal. For example, a rectangular wave having a period of 100 ms (or frequency of 10 Hz) and a 25% duty cycle would be high for 25 ms and low for 75 ms. Clock signals typically have a 50% duty cycle, where the signal is high for one half of the period and low for the other half. If a clock signal is expected to have a duty cycle of 50%, but its duty cycle departs from that ratio, then serious errors may result if the error is not detected and addressed.

Various embodiments of the disclosure include a clock-monitoring circuit that may be configured to repeatedly and/or continuously monitor the duty cycle of a clock signal with the speed required to support high-speed systems (e.g., ADAS components) without the use of a reference clock. The clock-monitoring circuit may be configured to identify, report, and/or respond to variations or abnormalities in the monitored clock. The clock-monitoring circuit may detect a variation in the waveform or duty cycle of a clock and initiate an error-mitigation action (e.g., by issuing an interrupt that a processor may react to) to prevent the variation from causing or resulting in a failure or a vulnerability to attack. Error-mitigation actions may include, for example, adjusting parameters of the clock-sourcing circuit to correct the error, resetting the clock-sourcing circuit, or switching to a backup clock-sourcing circuit. In addition, parameters related to the error detection may be recorded and/or transmitted in order to assist in failure analysis.

In some embodiments, as described in detail below, a duty-cycle-monitoring circuit uses a cascade of buffers, a plurality of flip-flops, and a controller to determine the duty cycle of a monitored clock signal. The duty-cycle-monitoring circuit encodes a measure of the duration of the high part of a clock cycle of the monitored clock signal and a measure of the duration of the low part of a clock cycle of the monitored clock signal based on the propagation progress of edges (or transitions—i.e., upticks and downticks) of the monitored clock signal through the cascade of buffers. Note that, the term measure, as used herein, is not restricted to any particular form or format and may be any indication of a corresponding duration. The duty-cycle-monitoring circuit may then calculate the duty cycle from the encoded measures. If the calculated duty cycle is different from the expected duty cycle, then the duty-cycle-monitoring circuit may issue an interrupt to initiate a correction or mitigation action.

FIG. 1 is a simplified partial schematic diagram of an exemplary system 100 in accordance with one embodiment. The system 100 may be an ADAS device. The system 100 includes an applications processor/central processing unit (AP/CPU) 108, a graphics processor (GPU) 106, a mobile display processor (MDP) 107, a camera-application (CAM) module 105, a resource and power management (RPM) processor 117, and a duty-cycle-monitoring circuit 101. The system may include any number of additional modules (not shown) whose functions are not essential for understanding the invention. Each of the AP/CPU 108, GPU 106, MDP 107, CAM 105, and RPM 117 may include a corresponding independent clock-generating module (CLK) that generates a corresponding clock signal that requires monitoring. As such, the clock output of each of these components may be coupled to the duty-cycle-monitoring component 101 via input bus 101a.

The duty-cycle-monitoring circuit 101 may be configured to receive a variety of clock inputs via input bus 101a, such as the illustrated CPU Clock, GPU Clock, MDP Clock, CAM Clock, and RPM Clock. The duty-cycle-monitoring circuit 101 may be configured to generate an interrupt output (INTERRUPT) via output 101b based on one or more of the clock inputs (e.g., CPU Clock, GPU Clock, MDP Clock, CAM Clock, or RPM Clock), and send the interrupt output to an error-handling component (not shown) that may initiate corrective/mitigation actions such as the examples provided above.

Figure 2:
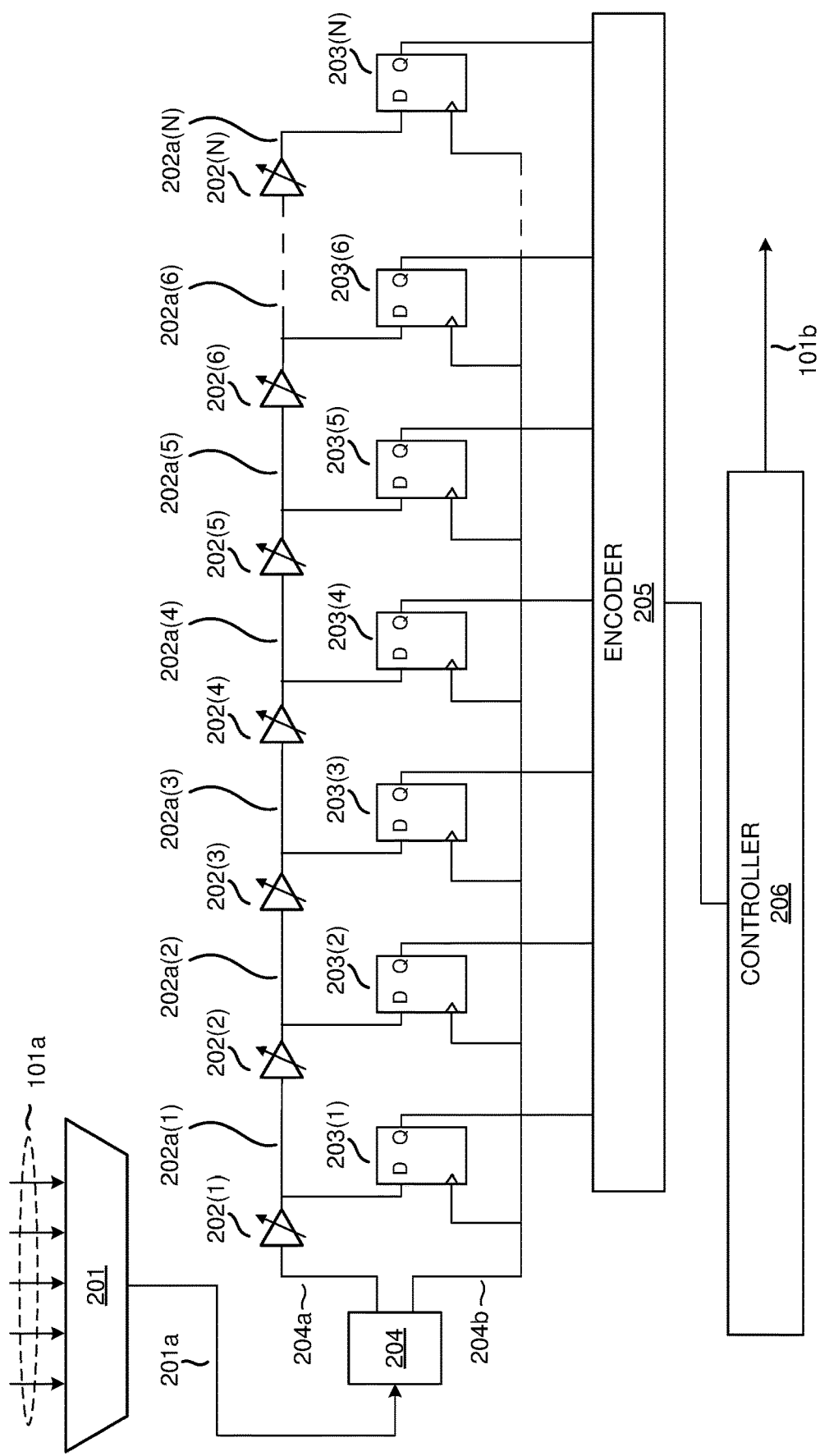
FIG. 2 is a simplified schematic diagram of the duty-cycle-monitoring circuit of FIG. 1 in accordance with one embodiment.

FIG. 2 is a simplified schematic diagram of the duty-cycle-monitoring circuit 101 of FIG. 1 in accordance with one embodiment. The duty-cycle-monitoring circuit 101 may include a selector 201, a clock/data module 204, a cascade of N variable-delay buffers 202(1)-202(N), a plurality of corresponding N D-type flip-flops 203(1)-203(N), an encoder 205, and a controller 206. Note that a cascade of buffers refers to a series of buffers where the input of every buffer, other than a first buffer, is the output of a previous buffer in the series. Note that, as used herein, the flip-flops may be referred-to collectively as flip-flops 203 or individually using a corresponding ordinal—e.g., flip-flop 203(2) or a variable integer i. Similarly, the buffers may be referred-to collectively as buffers 202 or individually using a corresponding ordinal—e.g., buffer 202(3) or a variable integer i. Also note that the encoder 205 and the controller 206 may be considered part of one control circuit.

The selector 201 receives the above-described plurality of clock signals via input bus 101a and selects one of the received plurality of clock signals for provision to the clock/data module 204 as clock signal 201a. The selection of the selector 201 may be determined by the controller 206. The selector 201 may be implemented using a multiplexor.

The clock/data module 204 outputs a data output 204a and a clock output 204b. The clock output 204b, which is provided to the clock inputs of each of the N flip-flops 203, follows the clock signal 201a, and is used to trigger the flip-flops 203. The data output 204a varies in accordance with below-described logic in order to allow encoding the durations, or temporal lengths, of the high and low parts of the clock signal 201a. The data output 204a may follow the clock signal 201a, may be the inverse of the clock signal 201a, may be forced low, or may be forced high.

The data output 204a is provided to the first buffer, buffer 202(1), of the cascade of N buffers 202. The delays of all of the buffers 202 may be the same. The programmable delay of each buffer 202(i) may be determined by the controller 206.

Each of the buffers from 202(1) to 202(N−1) provides its output to the next buffer in the cascade and to the D input of the corresponding flip-flop 203(i). Thus, for example, buffer 202(2) receives its input from buffer 202(1) and provides its output to the next buffer, buffer 202(3), and to a corresponding flip-flop 203(2). The last buffer, buffer 202(N), receives its input from buffer 202(N−1) and provides its output to the corresponding flip-flop, flip-flop 203(N). The cascade of buffers 202 works to propagate the data signal 204a from the first buffer 202(1) to the last buffer 202(N) at a delay determined by the programmable delay of each buffer 202(i). As explained below, the delayed propagation allows for measuring the duration of the high and low parts of the clock cycle, which may correspond to the widths of the illustrated high and low parts of the clock cycle in a timing diagram.

All of the flip-flops 203 are simultaneously triggered by the clock signal 204b. Flip-flops 203 may be dual-edge-triggered flip-flops where a flip-flop 203(i) is triggered by both rising edges and falling edges of the clock-input signal 204b. Each flip-flop 203(i) receives the output of the corresponding buffer 202(i) as its D input and provides its Q output to the encoder 205. Due to the operation of the duty-cycle-monitoring circuit 101, the output of the plurality of flip-flops 203 is an N-bit thermometric code that can then be encoded as an M-bit binary number, where $2^M \geq N$. A thermometric code is a numeric encoding that may represent increasing numbers by increasing the number of sequential ones. For example, 11111100 is an 8-bit thermometric code that can be represented as the 3-bit binary number 110, which is equal to the decimal number 6. The encoder 205 encodes its N-bit input into an M-bit output provided to the controller 206. The controller 206 then uses a plurality of received M-bit inputs to calculate, as described below, the duty cycle of the clock signal 201a and, if the duty cycle has a value that is different from an expected value, then the controller 206 may output an error signal, e.g., an interrupt, via output 101b.

Note that in some alternative embodiments, the clock signal 201a may be split and one branch provided directly to the clock inputs of the flip-flops 203, bypassing the clock/data module 204 and eliminating output 204b. In these alternative embodiments, a second branch of split clock signal 201a would be provided to the clock/data module 204, which would output data output 204a, as in the above-described embodiment.

Figure 3:
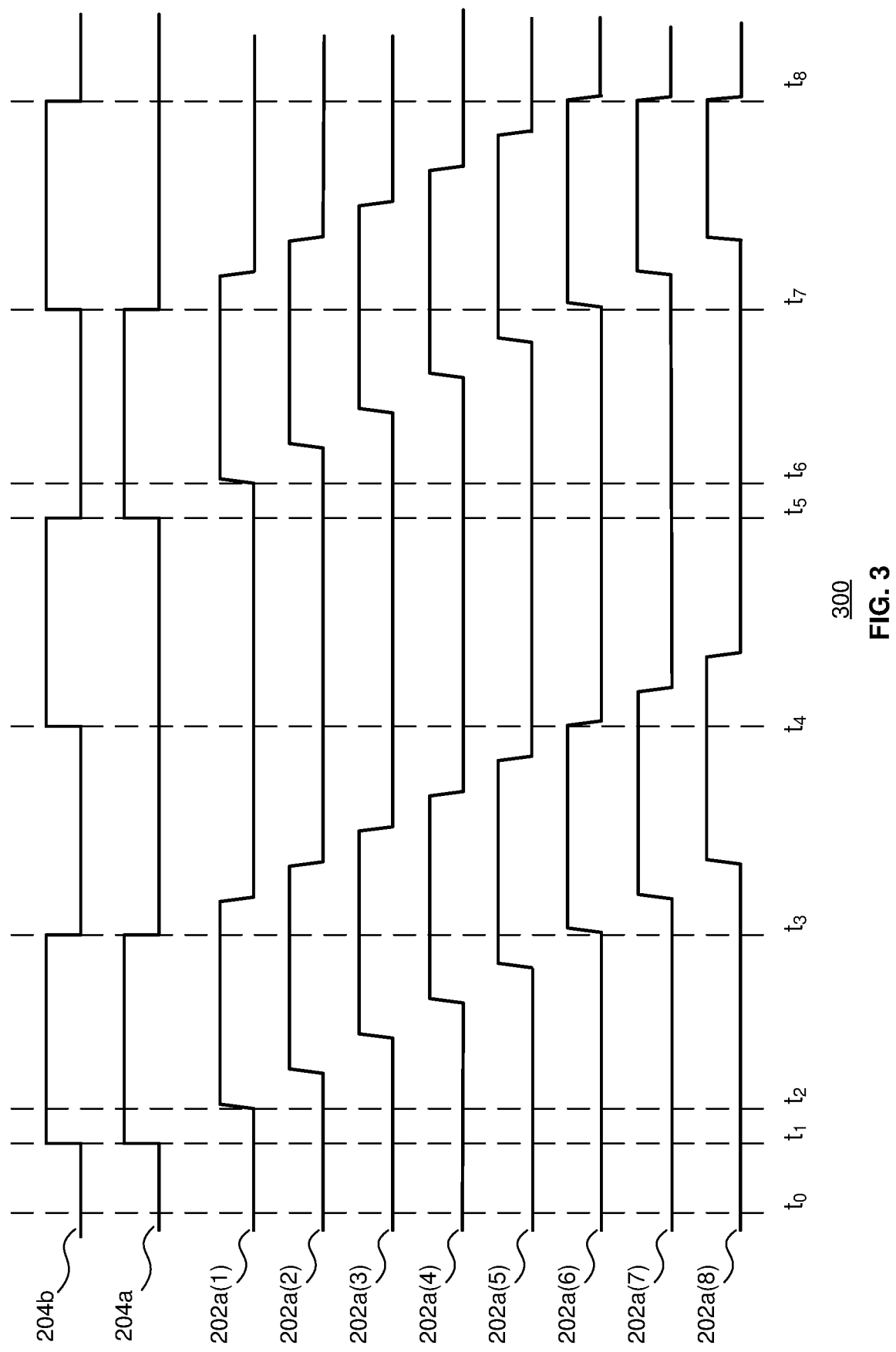
FIG. 3 is an exemplary timing diagram for an implementation of the duty-cycle-monitoring circuit of FIG. 1.

FIG. 3 is an exemplary timing diagram 300 for an implementation of the duty-cycle-monitoring circuit 101 of FIG. 1 that has eight cascading buffers 202 and eight corresponding flip-flops 203—in other words, where N=8. The timing diagram 300 includes the clock signal 204b, the data signal 204a, and the outputs 202a(1)-202a(8) of the cascading buffers 202(1)-202(8). As described above, the clock signal 204b follows the monitored clock signal 201a. Each output 202a(i) is the D input for the corresponding flip-flop 203(i).

At time $t_0$, the duty-cycle-monitoring circuit 101 has been recently reset and all the signals of the timing diagram 300 are low. At time $t_1$, the clock signal 204b goes high as does the data signal 204a. At time $t_2$, following the delay set by buffer 202(1), the signal 202a(1) goes high. The other buffer outputs 202a(2)-202a(8) subsequently follow serially after similar delays. At time $t_3$, the clock signal 204b goes low and so does the data signal 204a. The downtick of the clock signal 204b at time $t_3$ triggers the flip-flops 203.

Since at time $t_3$ the D inputs to flip-flops 203(1)-203(5) are high and the D inputs to flip-flops 203(6)-203(8) are low, the plurality of flip-flops 203 provide the thermometric output of 11111000 to the encoder 205, which, in turn, encodes that input into 101, which is equal to the decimal number 5 and which is indicative of the duration of the high portion of the monitored clock signal 201a. Following the downtick of the data signal 204a at time $t_3$, the buffer outputs 202a go low sequentially and at corresponding delays determined by the delay of the buffers 202.

At time $t_4$, the clock signal 204b goes high again. The data signal 204a is held low, however, and does not follow the clock signal 204b. By time $t_5$, the data signal 204a is set to be the inverse of the clock signal 204b in order to measure the length of the low portion of the clock signal 204b. At time $t_5$, the clock signal 204b goes low and the data signal 204a goes high. At time $t_6$, following the delay set by buffer 202(1), buffer output 202a(1) goes high. The other buffer outputs 202a(2)-202a(8) subsequently follow serially after similar delays. At time $t_7$, the clock signal 204b goes high and the data signal 204a goes low. The uptick of the clock signal 204b at time $t_7$ triggers the flip-flops 203.

Since at time $t_7$ the D inputs to flip-flops 203(1)-203(5) are high and the D inputs to flip-flops 203(6)-203(8) are low, the plurality of flip-flops 203 provide the thermometric output of 11111000 to the encoder 205, which, in turn, encodes that input into 101, which is equal to the decimal number 5 and which is indicative of the length of the low portion of the monitored clock signal 201a. The controller 206 then calculates the duty cycle as the ratio of the length of the high portion to the total length, as shown by equation (1) below.

$$\text{Duty Cycle} = \text{Length}_{HIGH}/(\text{Length}_{HIGH} + \text{Length}_{LOW}) \quad (1)$$

For the example given above, the duty cycle would be calculated as 5/(5+5) or 50%. Presuming this is the expected result, no error signal would be generated by the controller 206. On the other hand, if, for example, the lengths of the high and low portions would have been determined to be 4 and 6 time units, respectively, resulting in an unexpected duty cycle of 40%, then the controller 206 would output an error signal via output 101b.

Following the downtick of the data signal 204a at time $t_7$, the buffer outputs 202a go low sequentially and at delays determined by the buffers 202. At time $t_8$, the clock/data module 204 may reset the duty-cycle-monitoring circuit 101 and force all the buffer outputs 202a and/or the outputs of all the flip-flops 203 low. Subsequently, the above procedure may be repeated to continue monitoring the duty cycle of the clock signal 201a. Note that upticks and downticks of the clock signal 204b other than those described above may also trigger the flip-flops 203, which update their outputs accordingly. However, those outputs may be ignored by the encoder 205 and/or the controller 206.

Figure 4:
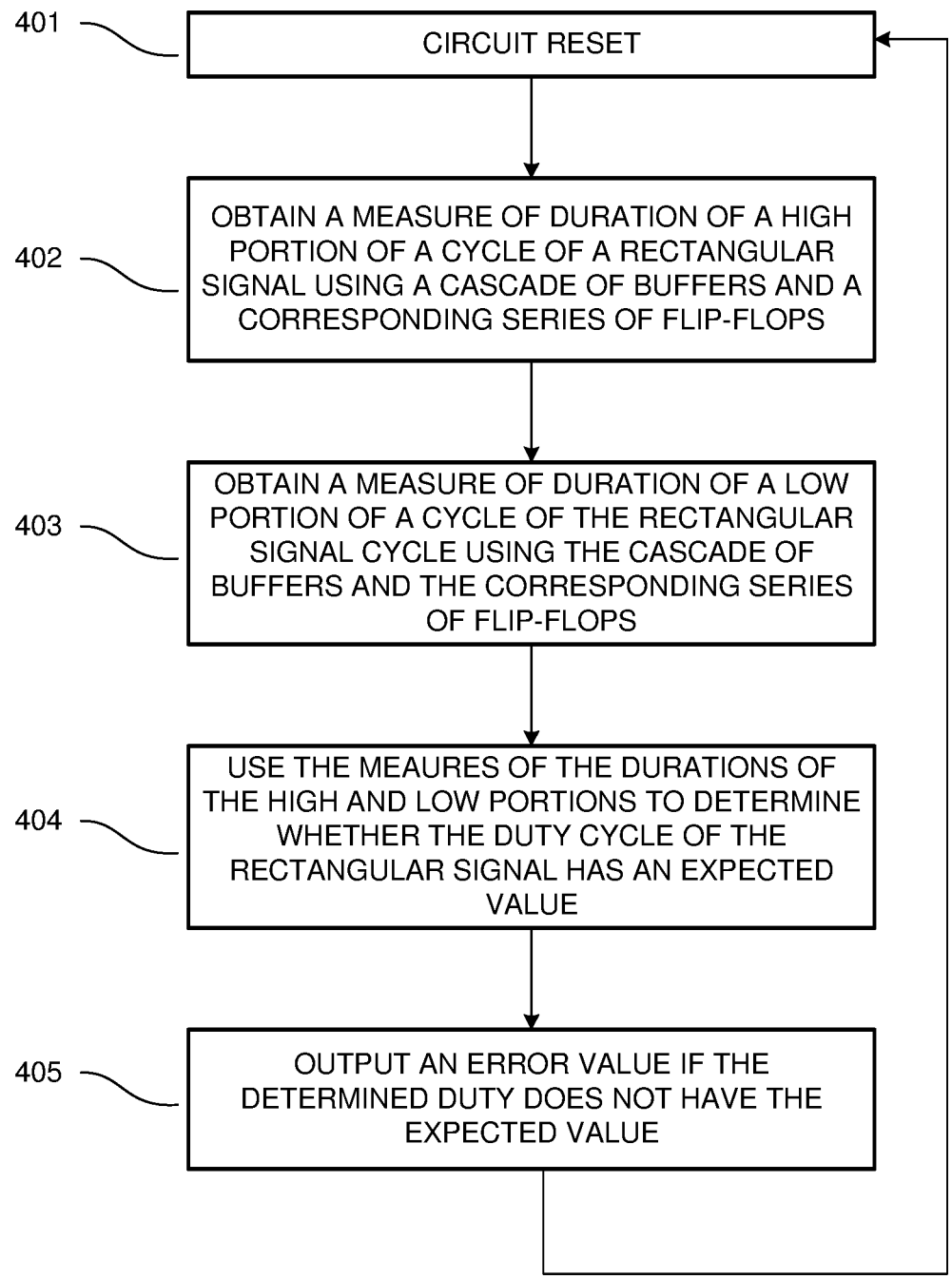
FIG. 4 is a flowchart of process in accordance with an embodiment of the disclosure such as the operation of the duty-cycle-monitoring circuit of FIG. 1.

FIG. 4 is a flowchart of process 400 in accordance with an embodiment of the disclosure such as the operation of duty-cycle-monitoring circuit 101 of FIG. 1. The process 400 starts with resetting the circuit (step 401). After reset, a measure of the duration of a high portion of a cycle of an input rectangular signal—such as clock signal 201a—is obtained using a cascade of buffers—such as buffers 202—and a plurality of corresponding flip-flops—such as flip-flops 203 (step 402). In addition, a measure of the duration of a low portion of a cycle of the input rectangular signal is obtained using the cascade of buffers and the plurality of corresponding flip-flops (step 403). It should be noted that the order of steps 402 and 403 may be reversed.

After measures of the high and low portions are obtained, the measures are used to determine whether the duty cycle of the rectangular signal has an expected value (step 404). Note that the expected value may be a range of values. The determination of whether the duty cycle has an expected value may involve the above-described encoding of obtained thermometric codes and calculations, but does not need to. For example, in some alternative embodiments, the duty cycle is calculated directly from the thermometric codes without further encoding of the thermometric code.

As a further example, if the expected duty cycle is 50%, then the low and high portions should have identical measures and those measures may be compared directly for equivalency without further encoding and/or explicitly calculating a duty-cycle value. In other words, two thermometric codes may be compared—using, for example, a bit-wise XNOR operation—and, if they are equivalent, then it may be concluded that the duty cycle has the expected value of 50%. If in step 404 is determined that the duty cycle does not have an expected value, then an error value is output (step 405). The process then returns to the reset step 401 and the process repeats for as long as the duty-cycle-monitoring system is enabled. Note that in some alternative embodiments, the process may return to step 402, rather than step 401, after step 405.

Figure 5:
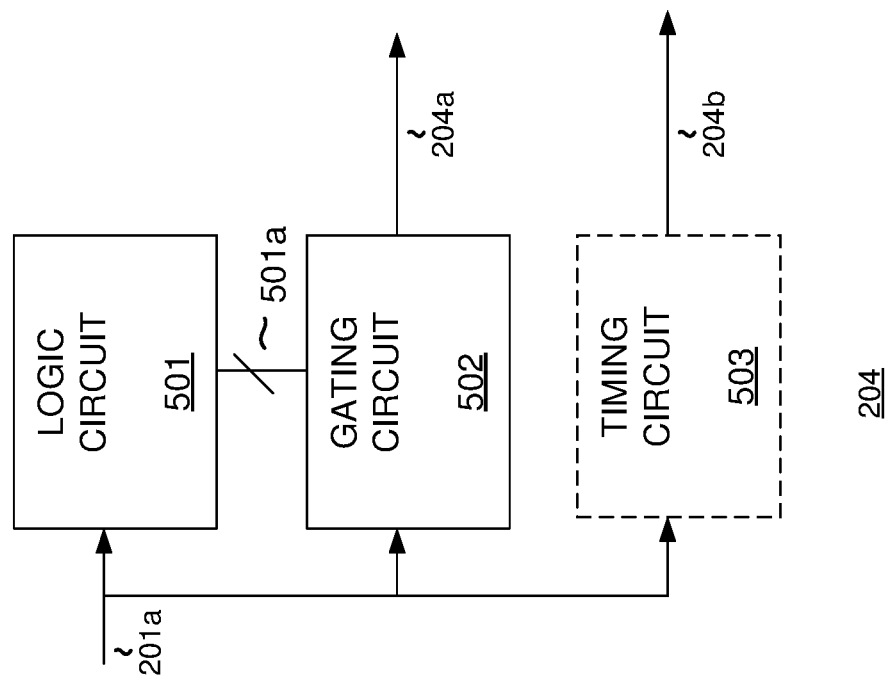
FIG. 5 is a simplified schematic diagram of an exemplary implementation of the clock/data module of FIG. 2.

FIG. 5 is a simplified schematic diagram of an exemplary implementation of the clock/data module 204 of FIG. 2. The clock/data module 204 comprises a logic circuit 501, a gating circuit 502, and an optional timing circuit 503, each of which receives the clock signal 201a as an input. The logic circuit 501 determines the output of the gating circuit 502, as described below. The optional timing circuit may include circuitry to adjust the phase of the output clock signal 204b if necessary to account for any phase delay of the data signal 204a relative to the input clock signal 201a that may result from the operation of the other circuits of the clock/data module 204. If the optional timing circuit is not used, then the clock signal 204b is equivalent to the input clock signal 201a.

The logic circuit 501 may implement a finite state machine that provides a digital control signal 501a to the gating circuit 502 to implement the above-described generation of the data signal 204a. Specifically, the logic circuit 501 controls the gating circuit 502 such that, after reset, the data signal 204a is low. Then, by a first rising edge of the clock signal 201a, the data signal 204a follows the clock signal 201a. After a first falling edge of the clock signal 201a, the data signal 204a continues following the clock signal 201a. Then, by a second rising edge of the clock signal 201a, the data signal 204a is held low. Then, by a second falling edge of the clock signal 201a, the data signal 204a is the inverse of the clock signal 201a. Then, after a third rising edge of the clock signal 201a, the data signal 204a may be held low. And then, after a third falling edge of the clock signal 201a, the duty-cycle-monitoring component is reset.

Figure 6:
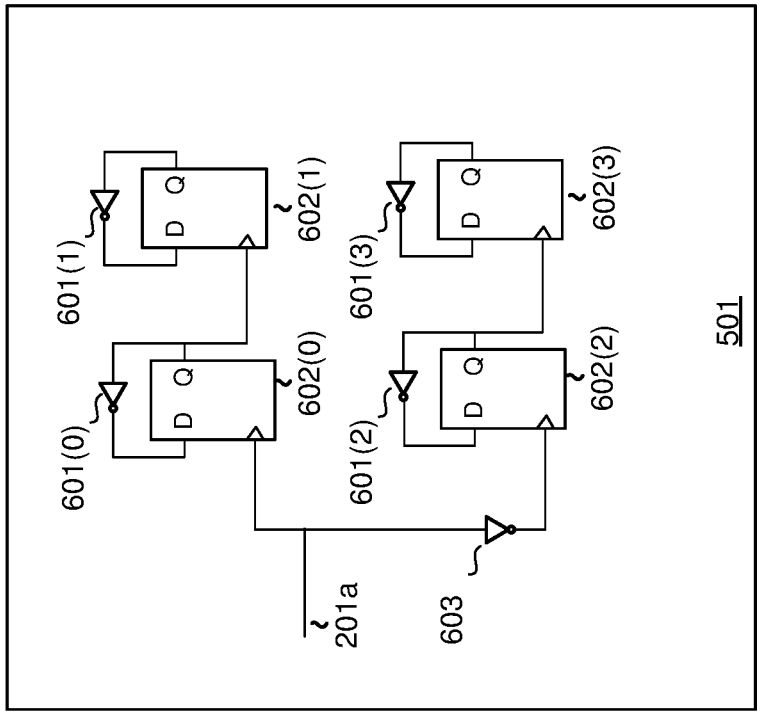
FIG. 6 is a simplified schematic diagram of an exemplary implementation of the logic circuit of FIG. 5.

FIG. 6 is a simplified schematic diagram of an exemplary implementation of the logic circuit 501 of FIG. 5. The logic circuit 501 comprises four rising-edge-triggered flip-flops 602(0)-602(3), where the Q output of each flip-flop 602(i) is fed back to its D input through a corresponding inverter 601(i). Flip-flop 602(0) is triggered by the clock signal 201a. Flip-flop 602(1) is triggered by the Q output of flip-flop 602(0). Flip-flop 602(2) is triggered by the inverse of the clock signal 201a, where the clock signal 201a is inverted by an inverter 603. Flip-flop 602(3) is triggered by the Q output of flip-flop 602(2). The Q outputs of the flip-flops 602 are bundled (not shown) into 4-bit digital signal 501a for provision to the gating circuit 502 for generating the data signal 204a and resetting the duty-cycle-monitoring circuit 101 as described above.

Figure 7:
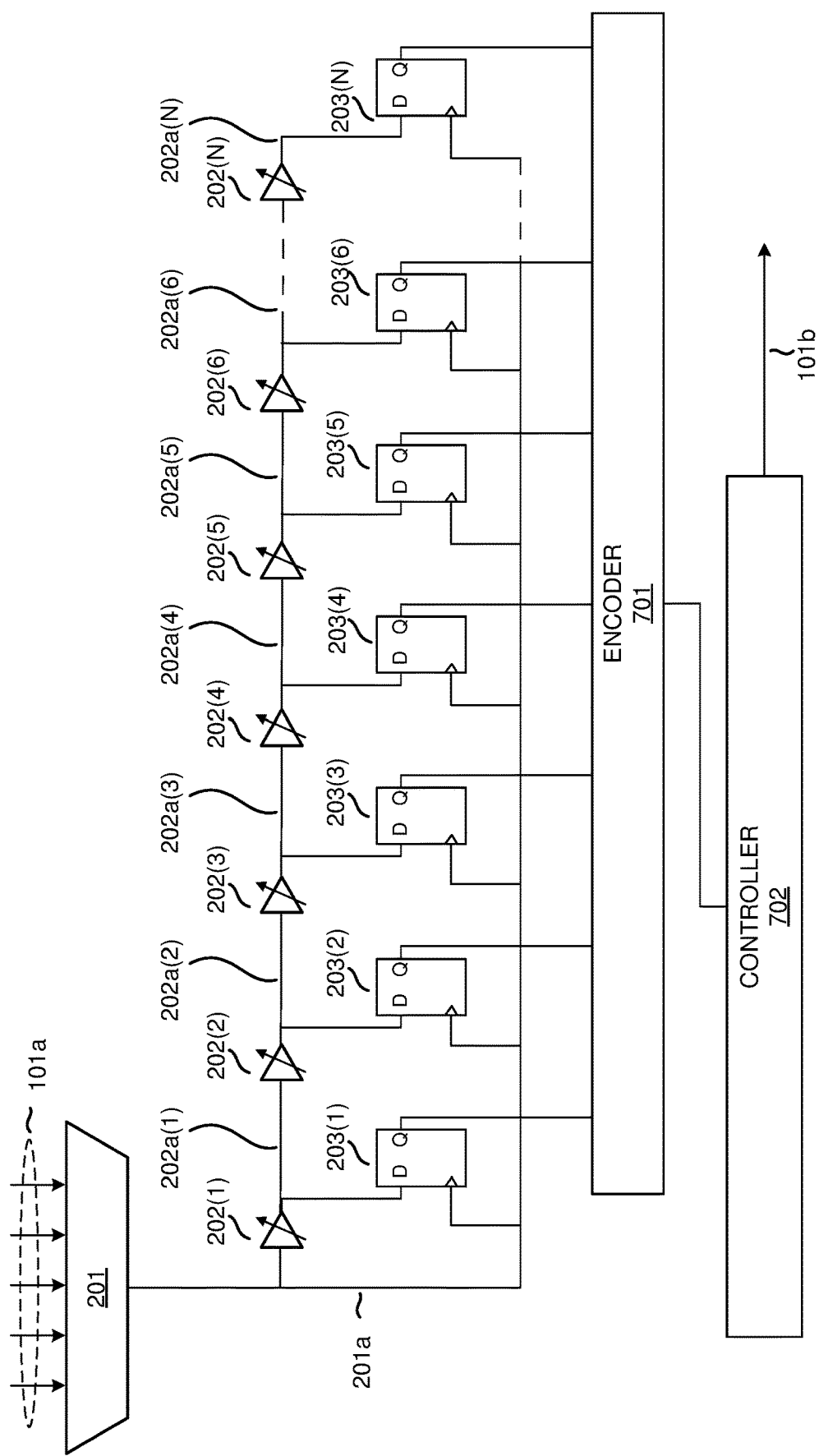
FIG. 7 is a simplified schematic diagram of a duty-cycle-monitoring component in accordance with another embodiment of the disclosure.

FIG. 7 is a simplified schematic diagram of a duty-cycle-monitoring circuit 700 in accordance with another embodiment of the disclosure. The duty-cycle-monitoring circuit 700 may be used in the system 100 in FIG. 1 instead of the duty-cycle-monitoring circuit 101. The duty-cycle-monitoring circuit 700 comprises many of the same components as the duty-cycle-monitoring component 101, which are similarly labeled in FIG. 7 and which operate in a similar way. The duty-cycle-monitoring circuit 700 does not use a clock/data module and the clock signal 201a is provided directly to the first buffer 202(1) of the cascade of buffers 202 and to the clock trigger input of each flip-flop 203(i) of the corresponding plurality of double-edge-triggered flip-flops 203. The outputs of the flip-flops 203 are provided to encoder 701, which is controlled by, and provides data to, controller 702. As explained in more detail below, the duty-cycle-monitoring circuit 700 obtains a measure of (1) the high part of the clock signal 201a in the same way as described above for duty-cycle-monitoring circuit 101 and (2) the low part of the clock signal 201a by using an inverted version of the outputs of the plurality of flip-flops 203.

Figure 8:
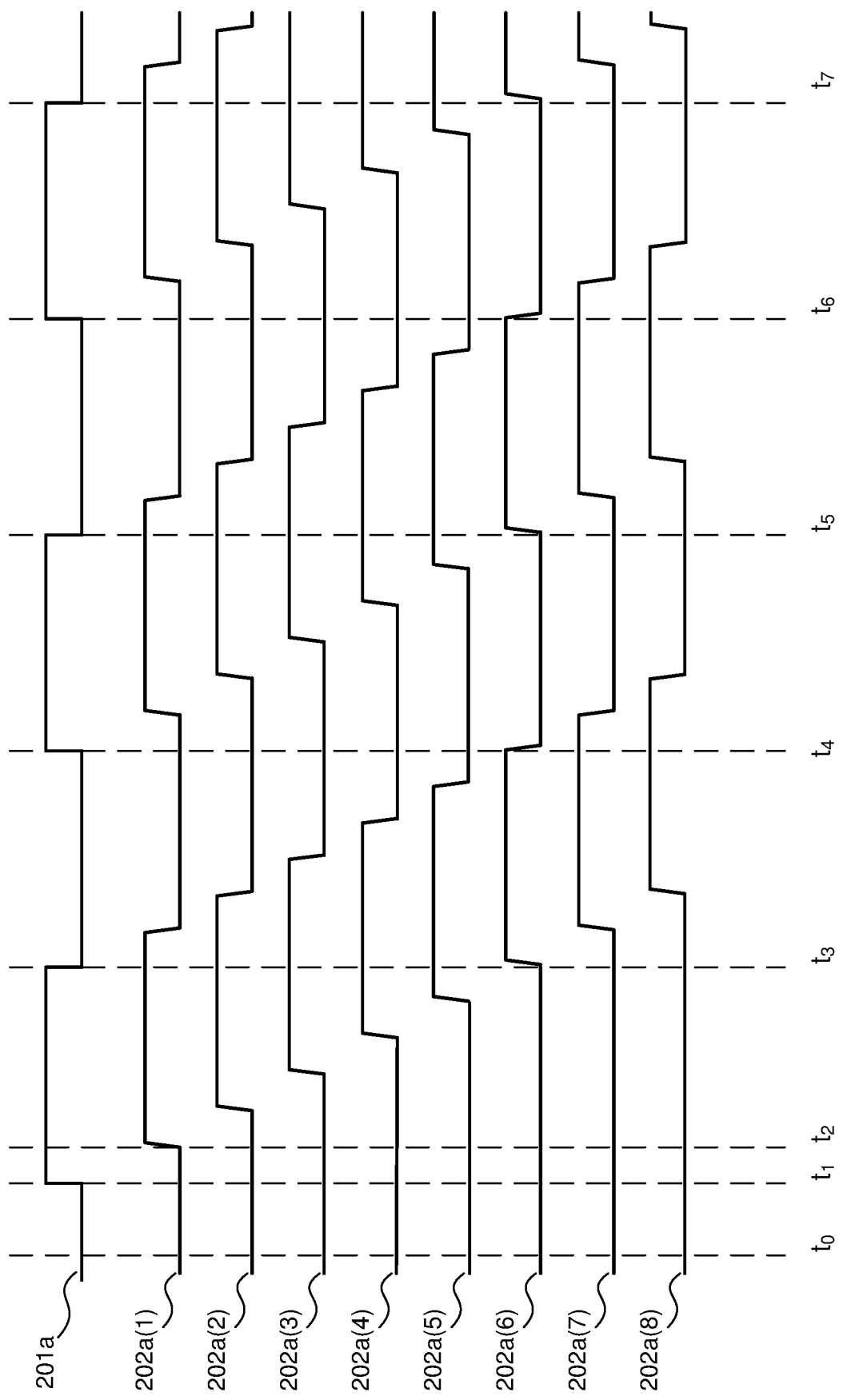
FIG. 8 is an exemplary timing diagram of various signals of the duty-cycle-monitoring circuit of FIG. 7.

FIG. 8 is an exemplary timing diagram 800 of various signals of the duty-cycle-monitoring circuit 700 of FIG. 7 that has eight cascading buffers 202 and eight corresponding flip-flops 203—in other words, where N=8. The timing diagram 800 includes the clock signal 201a and the outputs 202a(1)-202a(8) of the cascading buffers 202(1)-202(8). Each output 202a(i) is the D input for the corresponding flip-flop 203(i).

At time $t_0$, the duty-cycle-monitoring circuit 700 has been recently reset and all the signals of the timing diagram 800 are low. At time $t_1$, the clock signal 201a goes high. At time $t_2$, following the delay set by buffer 202(1), signal 202a(1) goes high. The other buffer outputs 202a(2)-202a(8) subsequently follow serially after similar delays. At time $t_3$, the clock signal 201a goes low. The downtick of the clock signal 201a at time $t_3$ triggers the flip-flops 203.

Since at time $t_3$ the D inputs to flip-flops 203(1)-203(5) are high and the D inputs to flip-flops 203(6)-203(8) are low, the plurality of flip-flops 203 provide the thermometric output of 11111000 to the encoder 701, which, in turn, encodes that input into 101, which is equal to the decimal number 5 and which is indicative of the length of the high portion of the monitored clock signal 201a. Following the downtick of the clock signal 201a at time $t_3$, the buffer outputs 202a go low sequentially and at delays determined by the buffers 202.

At time $t_4$, the clock signal 201a goes high again. The uptick of the clock signal 201a at time $t_4$ triggers the flip-flops 203. Since at time $t_4$ the D inputs to flip-flops 203(1)-203(5) are low and the D inputs to flip-flops 203(6)-203(8) are high, the plurality of flip-flops 203 provide the thermometric output of 00000111 to the encoder 701. The encoder 701 may perform a bitwise inversion of the received input to generate an inverted value of 11111000 that is in turn encoded into 101, which is equal to the decimal number 5 and which is indicative of the length of the low portion of the monitored clock signal 201a. In some alternative implementations, the encoder 701 may also be connected to receive input from ~Q outputs (not shown) of the flip-flops 203 and use those to obtain a similar thermometric code indicative of the duration of the low portion of the clock signal 201a. Note that at time $t_4$, the ~Q outputs of the plurality of flip-flops 203 would also generate the thermometric code 11111000. Note that the control circuit comprising the encoder 701 and the controller 702 may use other suitable alternatives to obtain a measure of the duration of the low portion of the clock signal 201a from the outputs of the flip-flops 203 at clock upticks such as at time $t_4$.

After measures of the high and low portions of the monitored clock signal 201a have been obtained, the controller 702 may then process the obtained measures of the high and low portions in any of the ways described elsewhere herein to determine whether the duty cycle of the clock signal 201a has an expected value and output a corresponding output based on the determination.

The duty-cycle-monitoring circuit 700 may repeat the above-described downtick encoding of time $t_3$ at time $t_5$ and/or time $t_7$ and/or any subsequent downtick. Similarly, the duty-cycle-monitoring circuit 700 may repeat the above-described uptick encoding of time $t_4$ at time $t_6$ and/or any subsequent uptick. The duty-cycle-monitoring circuit 700 may forgo obtaining the above-described measures for one or more upticks and/or downticks before resuming obtaining the above-described measures. Similarly, the duty-cyclemonitoring component 101 of FIG. 1 may also forgo obtaining measures of the high and/or low portions of the monitored clock signal 201a for one or more upticks and/or downticks before resuming obtaining the above-described measures.

It should be noted that, under certain circumstances in certain implementations, a thermometric "bubble" may be provided to the encoder, where a bubble refers to an improper thermometric code such as 11110011. Bubbles may result when the buffer delays are too long. There are multiple ways for the duty-cycle-monitoring component to handle thermometric bubbles. In one implementation, the encoder can modify the thermometric value so that all the bits from the first zero to the least significant bit are forced to be zero. For the example given above, that would change 11110011 to 1111000, which is in proper thermometric form.

In another implementation, the encoder may ignore the bits past the first zero in encoding its input. For the example given above, that would result in encoding 11110011 as 100, which corresponds to the decimal value 4. In some implementations, such as those that directly compare thermometric codes, the thermometric codes with bubbles may be used as they are. In other words, if the expected duty cycle is 50% and the controller compares thermometric codes for the high and low portions, then the presence of bubbles in the code should be irrelevant since both portions should have the same bubbles.

In another implementation, the presence of a bubble in the thermometric code may trigger an adjustment of the delay of the buffers 202. Specifically, the presence of a bubble indicates that the delay period of the buffers may be shortened, which would work to eliminate the bubble. In such embodiments, if a bubble is present in the measure of a particular cycle of the monitored signal, then that reading can be discarded and a later reading, after the delay period of the buffers 202 has been adjusted, used instead.

Note that if the thermometric code encoded by the encoder is all ones—e.g., 11111111—then the delay period of the buffers 202 may be too short and should be increased. Increasing the delay period of the buffers 202 so that the last bit is zero ensures that the entirety of the high or low portion is captured by the cascade of buffers, from uptick to downtick or downtick to uptick. In some embodiments, in order to maximize granularity, the delay period of the cascade of buffers may be adjusted so that the longer of the high and low portions of the monitored clock cycle generates a thermometric code where only the last bit is zero and the rest are ones.

Embodiments of duty-cycle-monitoring circuits have been described where a cascade of variable-delay buffers 202 are used. Variable-delay buffers are not, however, required. In some alternative embodiments, fixed-delay buffers may be used in place of the variable-delay buffers 202.

Embodiments of duty-cycle-monitoring circuits have been described that use an N:M encoder to encode the width of the low part and high part of a clock cycle. N:M encoders are not, however, required. In alternative embodiments, any suitable type of encoder may be used instead of the N:M encoder. In some alternative embodiments, the control circuit may forgo the encoder and provide the output of the plurality of flip-flops directly to the controller for processing (e.g., in the direct-comparison embodiment described above).

Embodiments of duty-cycle-monitoring circuits have been described where the monitored signal is a clock signal. The invention is not, however, limited to clock signals. Any substantially rectangular signal having a duty cycle may be monitored using the duty-cycle-monitoring circuits.

As described above, the output of the duty-cycle-monitoring circuit is used in maintaining the integrity, security, and/or safety of the comprising system. If the duty-cycle-monitoring circuit determines that a duty cycle does not have an expected value and, as a result, outputs an error message, then that error message indicates to the system a malfunction of, or an attack on, the system. In response to the error message, the system can take corrective or mitigating action to prevent further harm to the system. Conversely, if the duty-cycle-monitoring circuit does not output an error message, then that provides confirmation that the monitored signal is behaving normally and has an expected duty cycle.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for operating an adaptive clock distribution system. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

The invention claimed is:

1. A system comprising a duty-cycle-monitoring circuit configured to receive, from a signal-generating module, a monitored signal having cycles that have a high portion and a low portion, wherein:
   the duty-cycle-monitoring circuit comprises:
      a cascade of buffers including a first buffer, wherein the first buffer is configured to receive a first signal based on the monitored signal;
      a plurality of corresponding flip-flops, wherein:
         each flip-flop is triggered by a second signal based on the monitored signal; and
         the data input of each flip-flop is connected to an output of a corresponding buffer; and
      a control circuit configured to:
         determine, based on a state of the plurality of flip-flops, a measure of the duration of the high portion of a cycle of the monitored signal; and
         determine, based on a state of the plurality of flip-flops, a measure of duration of the low portion of a cycle of the monitored signal.

2. The system of claim 1, wherein the control circuit is further configured to use the measures of the durations of the high and low portions to determine whether a duty cycle of the monitored signal has an expected value.

3. The system of claim 2, wherein using the measures of the durations of the high and low portions to determine whether the duty cycle of the monitored signal has an expected value comprises comparing the measures of the durations of the high and low portions to determine whether they are equivalent.

4. The system of claim 1, wherein each flip-flop of the plurality of flip-flops is a dual-edge-triggered flip-flop.

5. The system of claim 1, wherein:
   the measure of the duration of the high portion is based on the outputs of the plurality of flip-flops at a downtick of the second signal; and
   the measure of the duration of the low portion is based on the outputs of the plurality of flip-flops at an uptick of the second signal.

6. The system of claim 5 wherein the second signal is identical to the monitored signal.

7. The system of claim 5, wherein:
   each flip-flop has a Q output;
   the Q outputs of the flip-flops, at a downtick of the second signal, define a first thermometric code; and
   the measure of the high portion of the cycle of the monitored signal is based on the first thermometric code.

8. The system of claim 7, wherein:
   the first signal corresponds to an inverse of the monitored cycle for the low portion of a first cycle of the monitored signal;
   the Q outputs of the flip-flops, at an uptick of the second signal corresponding to the end of the low portion of the first cycle, define a second thermometric code; and
   the measure of the duration of the low portion of the first cycle of the monitored signal is based on the second thermometric code.

9. The system of claim 7, wherein:
   each flip-flop has a ~Q output;
   the ~Q outputs of the flip-flops, at an uptick of the second signal, define a second thermometric code; and
   the measure of the duration of the low portion of the cycle of the monitored signal is based on the second thermometric code.

10. The system of claim 1, wherein the first and second signals correspond to the monitored signal such that the monitored signal is provided to the first buffer and each flip-flop is triggered by the monitored signal.

11. The system of claim 1, wherein:
   the duty-cycle-monitoring circuit further comprises a clock/data module that receives the monitored signal and outputs the first signal and the second signal.

12. The system of claim 11, wherein:
   the clock/data module comprises a logic circuit and gating circuit;
   the monitored signal is provided as an input to each of the logic circuit and the gating circuit;
   the logic circuit controls the gating circuit to output the first signal such that the first signal is the inverse of the monitored signal for the low portion of a cycle of the monitored signal.

13. The system of claim 12, wherein:
   the logic circuit comprises a first, second, third, and fourth flip-flop;
   the data input of each flip-flop receives an inverse of the output of the flip-flop;
   the first flip-flop is triggered by the monitored signal;
   the second flip-flop is triggered by the output of the first flip-flop;
   the third flip-flop is triggered by an inverse of the monitored signal;
   the fourth flip-flop is triggered the output of the third flip-flop;
   the outputs of the flip-flops define a digital code for controlling the gating circuit.

14. The system of claim 1, wherein:
   the plurality of flip-flops comprises N flip-flops;
   the control circuit comprise an N:M encoder and a controller;
   the encoder receives the outputs of the N flip-flops corresponding to the measures of the durations of the high and low portions;
   the encoder encodes the outputs into M-bit codes corresponding to the measures of the durations of the high and low portions, where N>M;
   the encoder provides the M-bit codes to the controller;
   the controller is configured to use the M-bit codes to determine whether a duty cycle of the monitored signal has an expected value.

15. The system of claim 1, wherein the system is an Advanced Driver Assistance System (ADAS).

16. A method for a system comprising a duty-cycle-monitoring circuit, the method comprising:
   receiving, by the duty-cycle-monitoring circuit, from a signal-generating module, a monitored signal having cycles that have a high portion and a low portion;
   providing a first signal based on the monitored signal to a first buffer of a cascade of buffers;
   providing a second signal based on the monitored signal to each of a plurality of flip-flops corresponding to the cascade of buffers, wherein:
      each flip-flop is triggered by the second signal; and
      the data input of each flip-flop is connected to the output of a corresponding buffer;
   determining, based on a state of the plurality of flip-flops, a measure of the duration of the high portion of a cycle of the monitored signal; and determining, based on a state of the plurality of flip-flops, a measure of the duration of the low portion of a cycle of the monitored signal.

17. The method of claim 16, further comprising using the measures of the durations of the high and low portions to determine whether a duty cycle of the monitored signal has an expected value.

18. The method of claim 17, wherein using the measures of the durations of the high and low portions to determine whether the duty cycle of the monitored signal has an expected value comprises comparing the measures of the durations of the high and low portions to determine whether they are equivalent.

19. The method of claim 16, wherein:
the measure of the duration of the high portion is based on the outputs of the plurality of flip-flops at a downtick of the second signal; and
the measure of the duration of the low portion is based on the outputs of the plurality of flip-flops at an uptick of the second signal.

20. The method of claim 19 wherein the second signal is identical to the monitored signal.

21. The method of claim 19, wherein:
each flip-flop has a Q output;
the Q outputs of the flip-flops, at a downtick of the second signal, define a first thermometric code; and
the measure of the duration of the high portion of the cycle of the monitored signal is based on the first thermometric code.

22. The method of claim 21, wherein:
the first signal corresponds to an inverse of the monitored cycle for the low portion of a first cycle of the monitored signal;
the Q outputs of the flip-flops, at an uptick of the second signal corresponding to the end of the low portion of the first cycle, define a second thermometric code; and
the measure of the low portion of the first cycle of the monitored signal is based on the second thermometric code.

23. The method of claim 21, wherein:
each flip-flop has a ~Q output;
the ~Q outputs of the flip-flops, at an uptick of the second signal, define a second thermometric code; and
the measure of the duration of the low portion of the cycle of the monitored signal is based on the second thermometric code.

24. The method of claim 16, wherein:
the plurality of flip-flops comprises N flip-flops;
the control circuit comprise an N:M encoder and a controller;
the method further comprises:
receiving, by the encoder, the outputs of the N flip-flops corresponding to the measures of the durations of the high and low portions;
encoding, by the encoder, the outputs into M-bit codes corresponding to the measures of the durations of the high and low portions, where N>M;
providing, by the encoder, the M-bit codes to the controller;
using, by the controller, the M-bit codes to determine whether a duty cycle of the monitored signal has an expected value.

25. The method of claim 16, wherein the system is an Advanced Driver Assistance System (ADAS).

26. A system comprising means for monitoring the duty cycle of a monitored signal, the system comprising:
means for receiving, from a signal-generating module, the monitored signal, which has cycles that have a high portion and a low portion;
means for providing a first signal based on the monitored signal to a first buffer of a cascade of buffers;
means for providing a second signal based on the monitored signal to each of a plurality of flip-flops corresponding to the cascade of buffers, wherein:
each flip-flop is triggered by the second signal; and
the data input of each flip-flop is connected to the output of a corresponding buffer;
means for determining, based on a state of the plurality of flip-flops, a measure of the duration of the high portion of a cycle of the monitored signal; and
means for determining, based on a state of the plurality of flip-flops, a measure of the duration of the low portion of a cycle of the monitored signal.

\* \* \* \* \*